(12) United States Patent
Kim

(10) Patent No.: US 8,128,752 B2
(45) Date of Patent: Mar. 6, 2012

(54) ROLL-TO-ROLL SUBSTRATE TRANSFER APPARATUS, WET ETCHING APPARATUS COMPRISING THE SAME AND APPARATUS FOR MANUFACTURING PRINTED CIRCUIT BOARD

(75) Inventor: Deok-heung Kim, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 489 days.

(21) Appl. No.: 12/317,562

(22) Filed: Dec. 23, 2008

(65) Prior Publication Data
US 2009/0159210 A1 Jun. 25, 2009

(30) Foreign Application Priority Data
Dec. 24, 2007 (KR) .................. 10-2007-0136376

(51) Int. Cl.
*C23F 1/00* (2006.01)
*B65G 13/02* (2006.01)
(52) U.S. Cl. ............... 118/718; 156/345.2; 193/35 R
(58) Field of Classification Search ........... 193/35 R; 118/718, 719, 720, 345.2, 345.23; 156/345.21, 156/345.22, 345.2
See application file for complete search history.

(56) References Cited

U.S. PATENT DOCUMENTS

| | | | | | |
|---|---|---|---|---|---|
| 3,637,062 | A | * | 1/1972 | Barton et al. | 198/346.3 |
| 4,526,643 | A | * | 7/1985 | Okano et al. | 156/345.46 |
| 5,364,225 | A | * | 11/1994 | Hecht et al. | 414/805 |
| 7,807,018 | B2 | * | 10/2010 | Kim, II | 156/345.23 |
| 7,896,968 | B2 | * | 3/2011 | Hirono et al. | 118/718 |
| 2007/0221330 | A1 | * | 9/2007 | Chang | 156/345.17 |
| 2009/0159210 | A1 | * | 6/2009 | Kim | 156/345.2 |

* cited by examiner

*Primary Examiner* — Sylvia R. MacArthur
(74) *Attorney, Agent, or Firm* — Drinker Biddle & Reath LLP

(57) ABSTRACT

In one aspect, a roll-to-roll substrate transfer apparatus is provided that includes: a feed roll and a take-up roll between which a printed circuit board substrate extends; and a plurality of drive roller rows transmitting motive power to the substrate for moving the substrate in a transferring direction, each drive roller row of the plurality includes a roller axis arranged in a direction perpendicular to the transferring direction of the substrate, and a plurality of spaced-apart drive rollers on the roller axis, wherein drive rollers of one drive roller row are arranged in spaces between drive rollers of adjacent drive roller rows. In other aspects, a wet etching apparatus and an apparatus for manufacturing a printed circuit board that include the roll-to-roll substrate transfer apparatus are provided.

21 Claims, 5 Drawing Sheets

ROLL-TO-ROLL SUBSTRATE TRANSFER APPARATUS, WET ETCHING APPARATUS COMPRISING THE SAME AND APPARATUS FOR MANUFACTURING PRINTED CIRCUIT BOARD

CROSS-REFERENCE TO RELATED PATENT APPLICATION

This application claims the benefit of Korean Patent Application No. 10-2007-0136376, filed on Dec. 24, 2007, in the Korean Intellectual Property Office, the disclosure of which is incorporated herein in its entirety by reference.

BACKGROUND OF THE INVENTION

1. Field of the Invention

The present invention relates generally to apparatuses and methods for manufacturing a printed circuit board. More particularly, the present invention relates to a roll-to-roll substrate transfer apparatus, a wet etching apparatus including the roll-to-roll substrate transfer apparatus, and an apparatus for manufacturing a printed circuit board including the roll-to-roll substrate transfer apparatus.

2. Description of the Related Art

Electronic apparatuses known in the art require a plurality of components. Compact electronic components are typically mounted on a printed circuit board comprising a conductive layer formed on a substrate formed of an insulating material. A circuit pattern is formed on or from the conductive layer. The printed circuit board includes a base substrate on which an inner layer circuit is formed, an interlayer insulating layer, an outer layer circuit layer, a resist layer, or the like.

A variety of processes such as etching, plating, exposure, and drilling are performed during the process of fabricating a circuit board. A dip rack method is often used as the etching or plating process. According to the dip rack method, a single panel-shaped substrate is dipped in a solution to plate the substrate and/or etch the conductive layer. However, the productivity and stability of the substrate are too low when using the dip rack method since one substrate is handled at a time. Another method known in the art is a conveyor method in which discrete substrates are placed on a conveyor system and transferred. However, the productivity of the substrate is also low, even if the stability of the substrate is higher than that when using the dip rack method.

Recently, a roll-to-roll transfer apparatus capable of continuously transferring substrates has been used in order to improve productivity. However, the use of the roll-to-roll transfer apparatus is limited since the thin film substrate may be damaged by overload (e.g., caused by over-tensioning or quick changes in transferring speed) during the transfer of the substrate.

SUMMARY OF THE INVENTION

The present invention provides a roll-to-roll substrate transfer apparatus using a roll-to-roll method to conveniently transfer a thin film substrate without breakage, a wet etching apparatus including the roll-to-roll substrate transfer apparatus, and an apparatus for manufacturing a printed circuit board.

According to an aspect of the present invention, there is provided a roll-to-roll substrate transfer apparatus comprising:

a feed roll and a take-up roll for continuous transfer of a substrate using a roll-to-roll method;

a first drive roller row contacting a surface of the substrate for transmitting motive power to the substrate, the first drive roller row comprising: a first roller axis arranged in a direction perpendicular to the transferring direction of the substrate; and a plurality of first drive rollers on the first roller axis which are spaced apart from each other along the first roller axis for rotating in a same direction as the transferring direction of the substrate;

a second drive roller row contacting the surface of the substrate for transmitting motive power to the substrate, the second drive roller row comprising: a second roller axis which is arranged in a direction perpendicular to the transferring direction of the substrate, the second roller axis being parallel to and spaced away from the first roller axis; and a plurality of second drive rollers on the second roller axis which are spaced apart from each other such along the second roller axis such that each of the second drive rollers is arranged in a space between adjacent first drive rollers, the second drive rollers being configured for rotating in a same direction as the transferring direction of the substrate; and a third drive roller row contacting the surface of the substrate for transmitting motive power to the substrate, the third drive roller row comprising: a third roller axis which is arranged in a direction perpendicular to the transferring direction of the substrate the third roller axis being parallel to and spaced away from the second roller axis; and a plurality of third drive rollers on the third roller axis which are spaced apart from each other along the third roller axis such that each of the third drive rollers is arranged in a space between adjacent second drive rollers, the third drive rollers being configured for rotating in a same direction as the transferring direction of the substrate.

The first drive rollers and the third drive rollers may be aligned with each other in the transferring direction.

The apparatus may further comprise:

a fourth drive roller row contacting an opposite surface of the substrate for transmitting motive power to the substrate, the fourth drive roller row comprising: a fourth roller axis arranged in a direction perpendicular to the transferring direction of the substrate; and a plurality of fourth drive rollers on the fourth roller axis which are spaced apart from each other along the fourth roller axis for rotating in a same direction as the transferring direction of the substrate;

a fifth drive roller row contacting the opposite surface of the substrate for transmitting motive power to the substrate, the fifth drive roller row comprising: a fifth roller axis which is arranged in a direction perpendicular to the transferring direction of the substrate, the fifth roller axis being parallel to and spaced away from the fourth roller axis; and a plurality of fifth drive rollers on the fifth roller axis which are spaced apart from each other such along the fifth roller axis such that each of the fifth drive rollers is arranged in a space between adjacent fourth drive rollers, the fifth drive rollers being configured for rotating in a same direction as the transferring direction of the substrate; and a sixth drive roller row contacting the opposite surface of the substrate for transmitting motive power to the substrate, the sixth drive roller row comprising: a sixth roller axis which is arranged in a direction perpendicular to the transferring direction of the substrate the sixth roller axis being parallel to and spaced away from the fifth roller axis; and a plurality of sixth drive rollers on the sixth roller axis which are spaced apart from each other along the sixth roller axis such that each of the sixth drive rollers is arranged in a space between adjacent fifth drive rollers, the sixth drive rollers being configured for rotating in a same direction as the transferring direction of the substrate.

The fourth drive rollers and the sixth drive rollers may be aligned with each other in the transferring direction.

The apparatus may further comprise a tension-maintaining member uniformly maintaining the tension of the substrate while the substrate is being transferred.

According to another aspect of the present invention, there is provided a wet etching apparatus comprising: the foregoing-described roll-to-roll substrate transfer apparatus with a feed roll and a take-up roll for continuous transfer of a substrate using a roll-to-roll method, and the first, second and third drive roller rows contacting a surface of the substrate; and a nozzle arranged to face the substrate and spraying an etching solution.

According to another aspect of the present invention, there is provided an apparatus for manufacturing a printed circuit board comprising: the foregoing-mentioned wet etching apparatus; and a laser drilling apparatus and an exposure apparatus disposed in the path of the substrate.

According to another aspect of the present invention, there is provided an apparatus for manufacturing a printed circuit board comprising:

a roll-to-roll substrate transfer apparatus comprising: a feed roll and a take-up roll for continuous transfer of a substrate using a roll-to-roll method; a first drive roller row contacting one surface of the substrate, transmitting power and comprising: a first roller axis which is arranged in a direction perpendicular to the transferring direction of the substrate; and a plurality of first drive rollers which are spaced apart from each other and are assembled with the first roller axis to rotate in a same direction as the transferring direction of the substrate; a second drive roller row contacting the one surface of the substrate, transmitting power and comprising: a second roller axis which is arranged in a direction perpendicular to the transferring direction of the substrate; and a plurality of second drive rollers which are spaced apart from each other such that one end of each of the second drive rollers is arranged in a space between adjacent first drive rollers and are assembled with the second roller axis to rotate in a same direction as the transferring direction of the substrate; and a third drive roller row contacting the one surface of the substrate, transmitting power and comprising: a third roller axis which is arranged in a direction perpendicular to the transferring direction of the substrate; and a plurality of third drive rollers which are spaced apart from each other such that one end each of the third drive rollers is arranged in a space between adjacent second drive rollers, and are assembled with the third roller axis to rotate in a same direction as the transferring direction of the substrate; and a plating apparatus comprising a plurality of contact points through which current is applied to the substrate, and disposed in the path of the substrate.

The plurality of contact points may move according to track-laying movement.

DETAILED DESCRIPTION OF THE EMBODIMENTS

Hereinafter, the present invention will now be described more fully with reference to the accompanying drawings, in which exemplary embodiments of the invention are shown.

Figure 1:
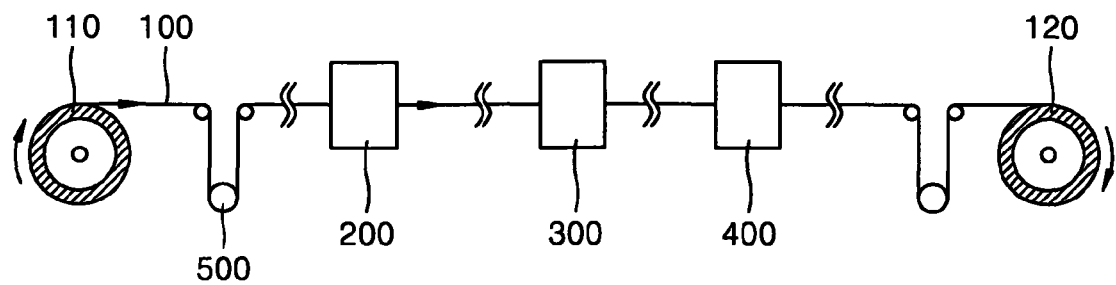
FIG. 1 is a schematic view of an apparatus for manufacturing a printed circuit board and including a roll-to-roll substrate transfer apparatus, according to an embodiment of the present invention.

FIG. 1 schematically shows an apparatus for manufacturing a printed circuit board and including a roll-to-roll substrate transfer apparatus, according to an embodiment of the present invention.

The roll-to-roll substrate transfer apparatus may be employed in a wet etching apparatus, or in an apparatus for manufacturing a printed circuit board and including the wet etching apparatus. For descriptive convenience, the roll-to-roll substrate transfer apparatus, which is applied to a wet etching apparatus used in an apparatus for manufacturing a printed circuit board, is described. However, the roll-to-roll substrate transfer apparatus may also be applied to a variety of processes for manufacturing a thin film using a roll-to-roll method.

Referring to FIG. 1, a substrate 100 is wound up on a feed roll 110. The substrate 100 may be a flexible substrate that can form a printed circuit board. A take-up roll 120 is arranged at a portion opposite to the feed roll 110 in order to wind up the substrate 100. The substrate 100 on the feed roll 110 is wound off to pass through each of the processes for manufacturing a printed circuit board and subsequently wound up on the take-up roll 120.

The substrate 100 may be formed of an insulating material, and may include a flexible material such as a resin. In some embodiments, the substrate 100 may include a conductive layer on one or both surfaces of the insulating material. In a circuit board, the conductive layer on which a wire that transmits electrical signals is formed may include copper or other metal.

The apparatus for manufacturing a printed circuit board may be configured with a variety of apparatuses in the transferring path of the substrate 100 for performing various processes. The apparatus for manufacturing a printed circuit board of FIG. 1 includes a laser drilling apparatus 200, a wet etching apparatus 300, and an exposure apparatus 400. Accordingly, it can be appreciated that the substrate 100 that is processed by the apparatus of FIG. 1 already is plated with the conductive layer.

The laser drilling apparatus 200 is used to form a through-hole in the substrate 100. Printed circuit boards produced by embodiments of the present apparatus may include a plurality of through-holes in order to connect a circuit pattern with an electronic component or to connect circuit patterns with each other arranged in other layers.

The wet etching apparatus 300 is used to etch a conductive layer on the substrate 100 on which the conductive layer (e.g., a copper layer) is formed. The exposure apparatus 400 is used to pattern a thin film (e.g., photoresist) formed on the substrate 100.

A tension-maintaining member 500 may be arranged in the vicinity of one or both of the feed roll 110 and the take-up roll 120 in order to maintain the tension of the transferred substrate 100.

Figure 2:
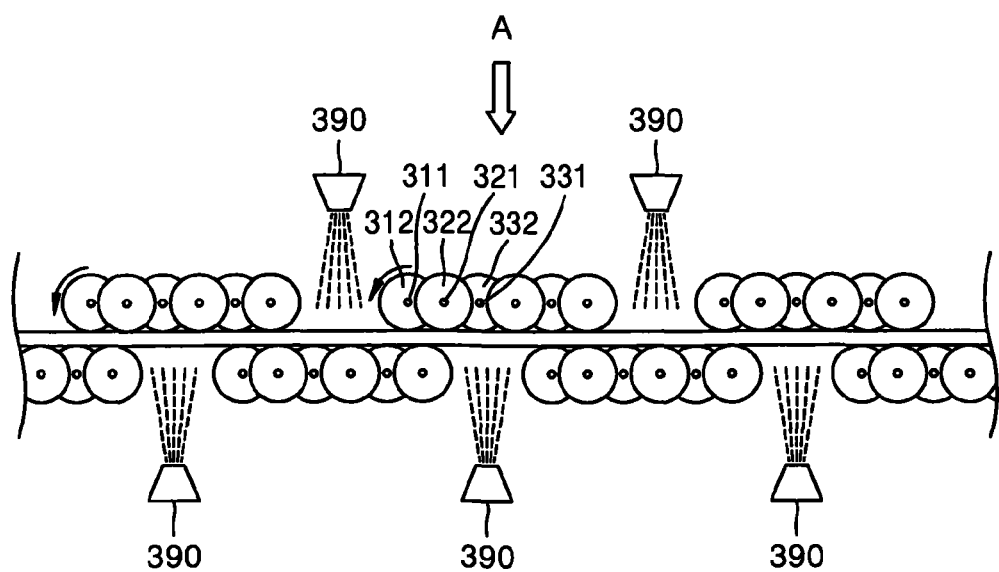
FIG. 2 is a view of a wet etching portion of the apparatus of FIG. 1.
Figure 3:
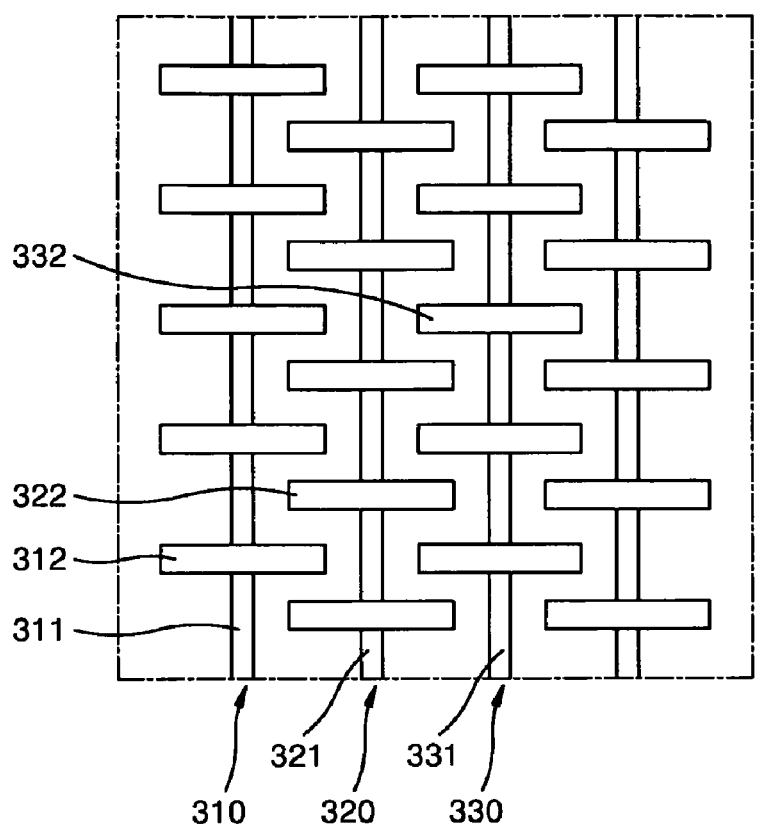
FIG. 3 is a plan view from position A of FIG. 2.

FIG. 2 is a view of the wet etching apparatus 300 of FIG. 1. FIG. 3 is a plan view from position A of FIG. 2.

As shown in FIG. 3, the wet etching apparatus 300 includes a first drive roller row 310, a second drive roller row 320, and a third drive roller row 330. However, the apparatus 300 may include fewer or additional rows of drive rollers. The first, second, and third drive roller rows 310, 320, and 330 receive power from a power source (e.g., a belt, a chain, a rotational actuator such as a motor, etc.) and transfer the motive power to the substrate 100.

The first drive roller row 310 includes a first roller axis 311 and a plurality of first drive rollers 312. The first roller axis 311 is arranged in a direction perpendicular to the transferring direction of the substrate 100, and the first drive rollers 312 are rotationally mounted on and spaced apart along the first roller axis 311 so that the first roller axis 311 functions as a rotation axis of the first drive rollers 312.

The first drive rollers 312 are spaced apart from each other, and contact the substrate 100 so as to rotate in the same direction (e.g., counterclockwise as shown in FIG. 2) as the transferring direction (e.g., in the rightward direction as shown in FIG. 2) of the substrate 100. The substrate 100 is transferred from the feed roll 110 to the take-up roll 120, and wound up on the take-up roll 120 at least partially due to the rotation of the first drive rollers 312.

The second drive roller row 320 includes a second roller axis 321 and a plurality of second drive rollers 322. The second roller axis 321 is arranged in a direction perpendicular to the transferring direction of the substrate 100. The second roller axis 321 is spaced away from and parallel to the first roller axis 311. The second drive rollers 322 are assembled with the second roller axis 321 so that the second roller axis 321 functions as a rotation axis of the second drive rollers 322.

The second drive rollers 322 are spaced apart from each other such that each second drive roller is arranged in a space between adjacent first drive rollers 312. In particular, one end of each of the second drive rollers 322 is arranged in a space between adjacent first drive rollers 312. As a result, portions of the first drive rollers 312 and the second drive rollers 322 appear overlapped if viewed from the direction of the first roller axis 311, as shown in FIG. 2.

The second drive rollers 322 contact the substrate 100 so as to rotate in the same direction as the transferring direction of the substrate 100. The substrate 100 is transferred from the feed roll 110 to the take-up roll 120, and wound up on the take-up roll 120 at least partially due to the rotation of the second drive rollers 322.

The spaces between adjacent first drive rollers 312 should be large enough for the arrangement therebetween of the respective second drive rollers 322. That is, the first drive rollers 312 should be spaced apart from each other such that the interval between the first driver rollers 312 is larger than the thickness of each of the second drive rollers 322 in order to arrange each of the second drive rollers 322 between adjacent first drive rollers 312.

The third drive roller row 330 includes a third roller axis 331 and a plurality of third drive rollers 332. The third roller axis 331 is arranged in a direction perpendicular to the transferring direction of the substrate 100. The third roller axis 331 is spaced away from and parallel to the second roller axis 321. The third drive rollers 332 are assembled with the third roller axis 331 so that the third roller axis 331 functions as a rotation axis of the third drive rollers 332.

The third drive rollers 332 are spaced apart from each other, and are each arranged in a space between adjacent second drive rollers 322. As shown in FIG. 3, the third drive rollers 332 may be configured on the third roller axis 331 to have a substantially similar spacing as the first drive rollers 312 along the first roller axis 311. That is, the first and third drive rollers 312, 332 may be substantially aligned in the substrate transferring direction. One end of each of the third drive rollers 332 is arranged in a space between adjacent second drive rollers 322. As a result, portions of the second drive rollers 322 and the third drive rollers 332 look overlapped if viewed from the direction of the first roller axis 311, as shown in FIG. 2.

The third drive rollers 332 contact the substrate 100 so as to rotate in the same direction as the transferring direction of the substrate 100. The substrate 100 is transferred from the feed roll 110 to the take-up roll 120, and wound up on the take-up roll 120 at least partially due to the rotation of the third drive rollers 332.

The spaces between adjacent second drive rollers 322 should be large enough for the arrangement of their respective third drive rollers 332. That is, the second drive rollers 322 should be spaced apart from each other such that the interval between the second driver rollers 322 is larger than the thickness of each of the third drive rollers 332 in order to arrange the third drive rollers 332 each between adjacent second driver rollers 322.

A plurality of rollers respectively in the first drive roller row 310, the second drive roller row 320, and the third drive roller row 330 are arranged to contact the substrate 100 and rotate to stably support and transfer the substrate 100. Thus, the substrate 100 proceeds according to the rotating direction of the first drive roller 312, the second drive roller 322, and the third drive roller 332, and is wound up on the take-up roll 120.

If the transfer of the substrate 100 were to depend only on the driving force of the feed roll 110 and the take-up roll 120 (as per conventional roll-to-roll transferring apparatuses known in the art), the substrate 100 may become thinned and distorted due to an overload. In particular, the substrate 100 may be damaged by the overload in the vicinity of the feed roll 110 and the take-up roll 120 supplying the driving force.

However, according to the present embodiment, a plurality of drive rollers such as the first, second, and third drive roller rows 310, 320, and 330 transmit motive power. As a result, the driving force is distributed along a length of the substrate 100 instead of concentrating the motive force at the take-up roll 120. Furthermore, since the first drive rollers 312 are interlaid with the second drive rollers 322, and the second drive rollers 322 are also interlaid with the third drive rollers 332 the substrate 100 may be adequately supported.

Based on the interlaid arrangement, load may be uniformly distributed on the substrate 100. Since the first drive rollers 312 and the second drive rollers 322 are interlaid, the first drive rollers 312 and the second drive rollers 322 can be more uniformly arranged on a substantial entire region of the substrate compared to drive rollers which are linearly arranged (see, for example, FIG. 4). Thus, load applied to the substrate 100 from the drive rollers is uniformly distributed. In addition, the interlaid structure may narrow the distance between the first drive roller row 310 and the second drive roller row 320, thereby increasing the effects on distributing the load.

In addition, the second drive rollers 322 are interlaid with the third drive rollers 332 so as to uniformly distribute load applied to the substrate 100.

The transfer of a thin film substrate may cause problems in a roll-to-roll substrate transfer method. However, according to the present embodiment, the first, second, and third drive rollers 312, 322, and 332 are interlaid, and the distance between the first drive roller row 310, the second drive roller row 320, and the third drive roller row 330 is narrowed so that load applied to the substrate 100 from the drive rollers can be uniformly distributed, thereby minimizing load on each load point of the substrate 100.

Figure 4:
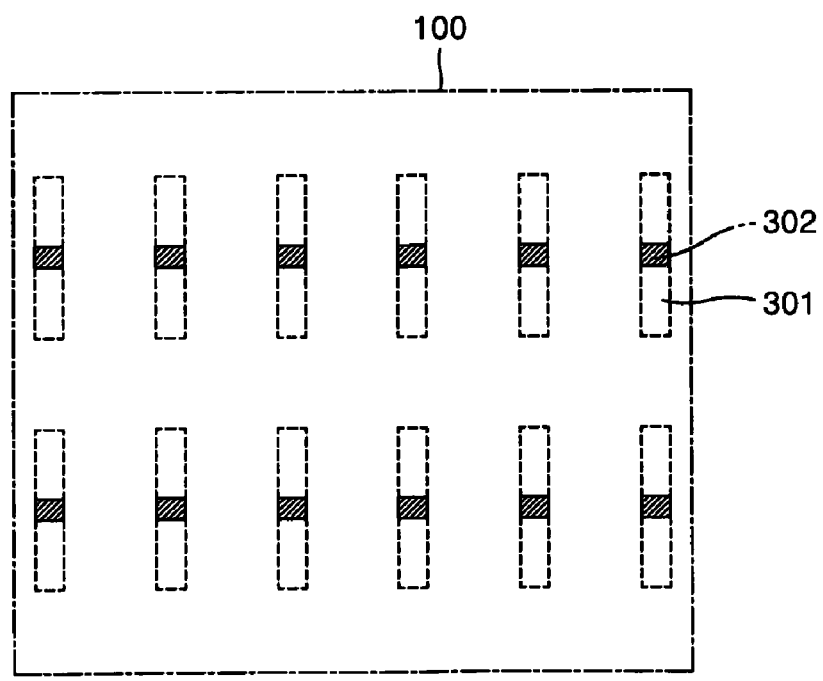
FIG. 4 shows show load points of a substrate in a conventional roll-to-roll substrate transfer apparatus.
Figure 5:
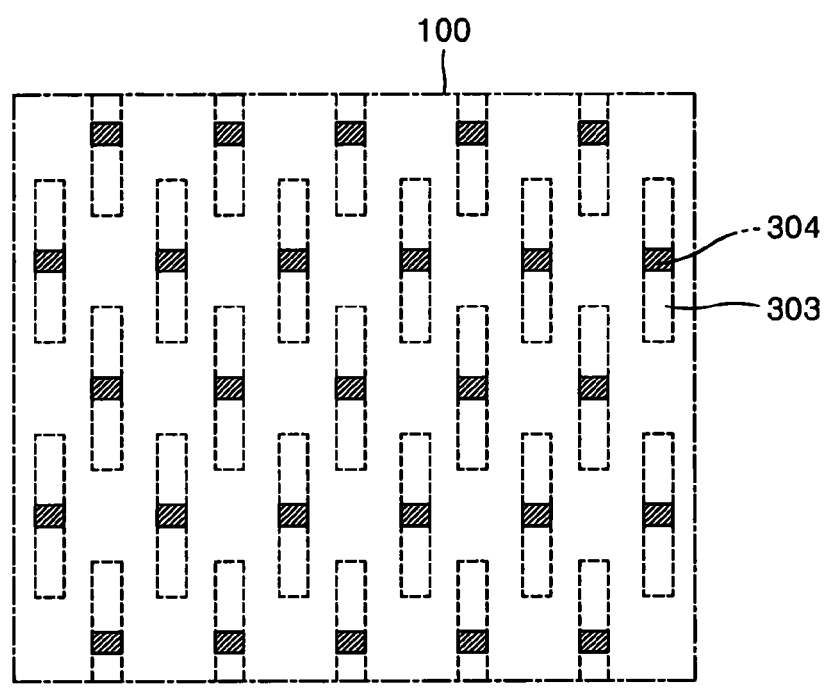
FIG. 5 shows load points of a substrate in a roll-to-roll substrate transfer apparatus according to an embodiment of the present invention.

FIGS. 4 and 5 show load points 302 and 304 (i.e., locations/ areas where the rollers contact a portion of the substrate's surface) on the substrate 100 in a roll-to-roll substrate transfer apparatus respectively according to a linear arrangement and the present embodiment of the present invention. In FIG. 4, drive rollers are linearly arranged on the substrate 100, and in FIG. 5, drive rollers are interlaid as described in the present embodiment. Referring to FIG. 4, a contour line 301 of each of the drive rollers is indicated by a dotted line, and the load points 302 which contact the substrate 100 are indicated as a rectangle on the substrate 100. Referring to FIG. 5, a contour line 303 of each of the driver rollers is indicated by a dotted line, and the load points 304 are indicated as a rectangle 304 on the substrate 100.

Since the drive rollers are interlaid in the structure shown in FIG. 5, the load points 304 are uniformly distributed on the entire substrate 100, and there are more load points 304 arranged in the same area of the substrate 100 as compared to the structure shown in FIG. 4.

Thus, according to the present embodiment, load applied by load points 304 of the substrate 100 can be reduced by uniformly distributing the load from the driver rollers contacting the surface of the substrate 100. As a result, the substrate 100 can be efficiently transferred from the feed roll 110 to the take-up roll 120 using the roll-to-roll method by preventing the substrate 100 from being damaged, even if the substrate 100 is thin.

The number and configuration of drive roller rows may vary from the example embodiment illustrated in FIG. 2. As shown, the apparatus of FIG. 2 may include six drive roller rows, but the number of drive roller rows is not limited thereto. That is, the number of drive roller rows may vary without limitation according to the conditions of the process, and the drive rollers are interlaid with each other. In addition, the apparatus may include a plurality of drive roller groups (e.g., three groups above the substrate 100 and four groups below the substrate 100), each of which includes a plurality of drive roller rows and rollers arranged adjacent to each other.

The drive rollers may be disposed on both surfaces of the substrate 100 shown in FIG. 2. The drive rollers arranged on a bottom surface of the substrate 100 of FIG. 2 are the same as the first, second, and third drive rollers 312, 322, and 332. That is, a plurality of drive rollers is arranged on the bottom surface of the substrate 100, such that the drive rollers are interlaid. Descriptions thereof are presented above and, therefore, are not repeated for brevity.

As further shown in FIG. 2, the wet etching apparatus 300 further includes a nozzle 390 spraying an etching solution, and is arranged to face the substrate 100. The nozzle 390 is arranged at one side of the substrate 100 if only one surface of the substrate 100 is etched, and arranged at both sides of the substrate 100 if both surfaces of the substrate 100 are etched.

The arrangement of the nozzle 390 may vary without limitation, but the nozzle 390 may be arranged to face a region on which the drive rollers are not arranged (e.g., between drive roller groups) for efficiency of the etching process, as shown in FIG. 2.

Figure 6:
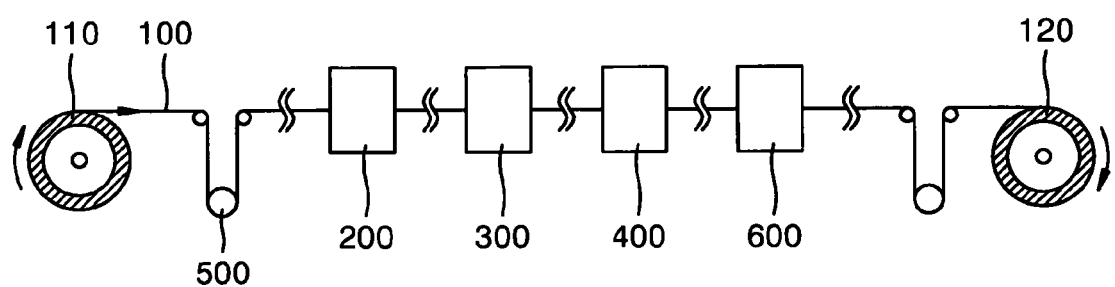
FIG. 6 is a schematic view of an apparatus for manufacturing a printed circuit board, according to another embodiment of the present invention.

FIG. 6 is a schematic view of an apparatus for manufacturing a printed circuit board according to another embodiment of the present invention. For descriptive convenience, the apparatus will be described based on the features that are different from those of the previous embodiment. Like reference numerals in the drawings denote like elements.

Referring to FIG. 6, a substrate 100 is wound up on a feed roll 110. The substrate 100 may be a flexible substrate on which a printed circuit board can be formed. A take-up roll 120 is arranged at a portion opposite to the feed roll 110 in order to wind up the substrate 100. The substrate 100 wound up on the feed roll 110 is wound off to pass through each of the processes for manufacturing a printed circuit board, and wound up on the take-up roll 120.

A variety of apparatuses may be disposed in the apparatus for manufacturing a printed circuit board so as to be in the transferring path of the substrate 100 to perform various processes. The apparatus of FIG. 6 includes a laser drilling apparatus 200, a wet etching apparatus 300, an exposure apparatus 400, and a plating apparatus 600.

In addition, a tension-maintaining member 500 may be arranged in the vicinity of at least one of the feed roll 110 and the take-up roll 120 in order to maintain the tension of the transferred substrate 100.

Figure 7:
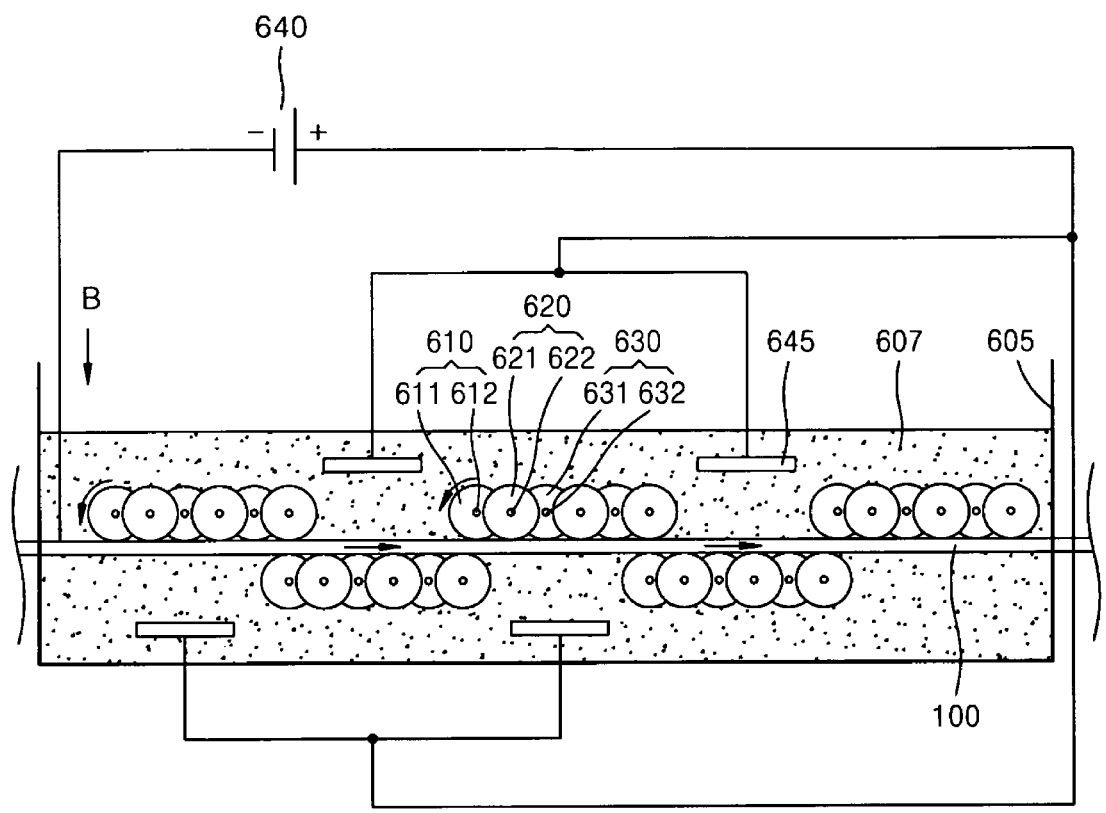
FIG. 7 is a view of a plating portion of the apparatus of FIG. 4.
Figure 8:
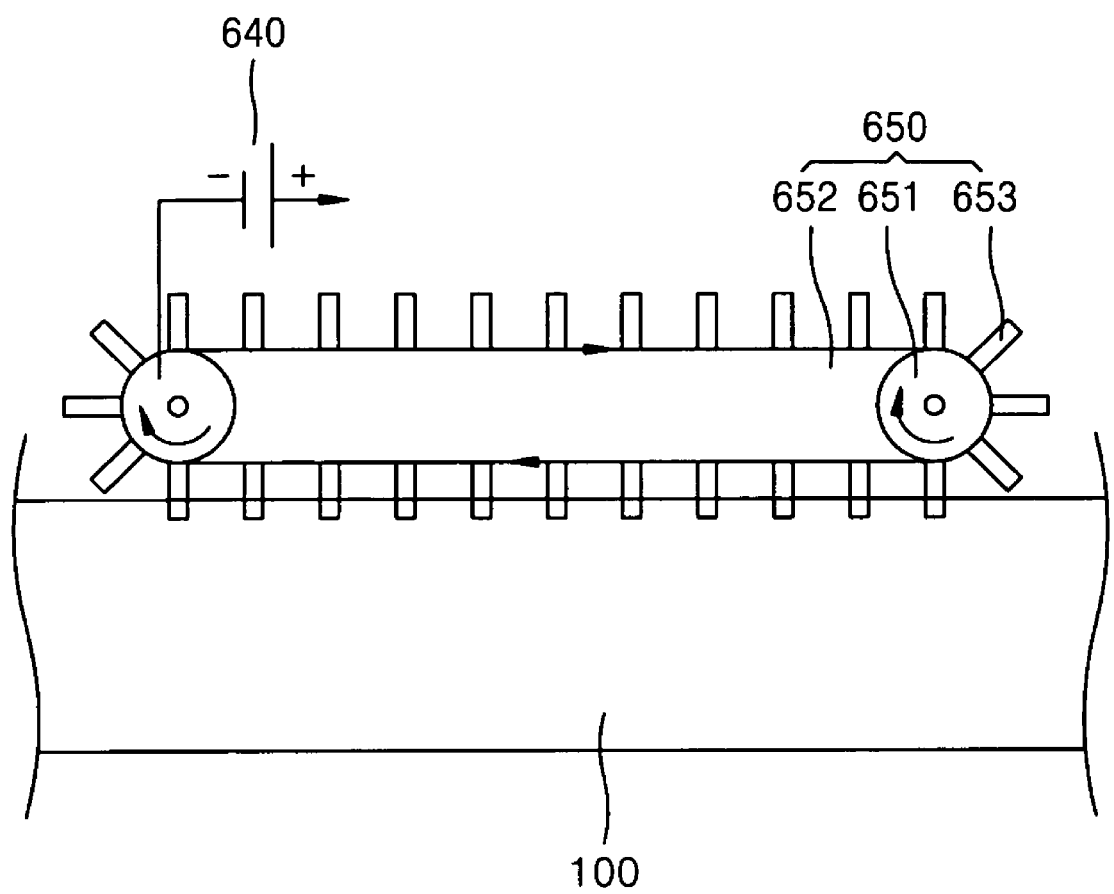
FIG. 8 is a plan view from position B of FIG. 7.

FIG. 7 is a schematic view of the plating apparatus 600 of FIG. 6. FIG. 8 is a plan view from position B of FIG. 7.

As shown in FIG. 7, the plating apparatus 600 includes a first drive roller row 610, a second drive roller row 620, a third drive roller row 630, an electrolyzer 605, an electrolytic solution 607, a power supply unit 640, and a continuous-type cathode device 650 (shown in FIG. 8). Although three rows 610, 620, 630 are described hereinafter, the apparatus 600 may include fewer or additional rows.

The first drive roller row 610 includes a first roller axis 611 and a plurality of first drive rollers 612. The first roller axis 611 is arranged in a direction perpendicular to the transferring direction of the substrate 100, and the first drive rollers 612 are assembled with the first roller axis 611 so that the first roller axis 611 functions as a rotation axis of the first drive rollers 612.

The plurality of the first drive rollers 612 are spaced apart from each other, and contact the substrate 100 so as to rotate in the same direction as the transferring direction of the substrate 100. The substrate 100 is transferred from the feed roll 110 to the take-up roll 120, and wound up on the take-up roll 120 at least partially due to the rotation of the first drive rollers 612.

The second drive roller row 620 includes a second roller axis 621 and a plurality of second drive rollers 622. The second roller axis 621 is arranged in a direction perpendicular to the transferring direction of the substrate 100, and the second drive rollers 622 are assembled with the second roller axis 621 so that the second roller axis 621 functions as a rotation axis of the second drive rollers 622. The second roller axis 621 is parallel to and spaced apart from the first roller axis 611.

The second drive rollers 622 are spaced apart from each other along the second roller axis 621, and are each arranged in a space between adjacent first drive rollers 612. In particular, one end of each of the second drive rollers 622 is arranged in a space between adjacent first drive rollers 612. As a result, portions of the first drive rollers 612 and the second drive rollers 622 look overlapped if viewed from the direction of the first roller axis 611, as shown in FIG. 7.

The second drive rollers 622 contact the substrate 100 so as to rotate in the same direction as the transferring direction of the substrate 100. The substrate 100 is transferred from the feed roll 110 to the take-up roll 120, and wound up on the take-up roll 120 at least partially due to the rotation of the second drive rollers 622.

The spaces between adjacent first drive rollers 612 should be large enough for the arrangement of their respective second drive rollers 622. That is, the first drive rollers 612 should be spaced apart from each other such that the interval between the first driver rollers 612 is larger than the thickness of each of the second drive rollers 622 in order to arrange the second drive rollers 622 each between adjacent first driver rollers 612.

The third drive roller row 630 includes a third roller axis 631 and a plurality of third drive rollers 632. The third roller axis 631 is arranged in a direction perpendicular to the transferring direction of the substrate 100, and the third drive rollers 632 are assembled with the third roller axis 631 so that the third roller axis 631 functions as a rotation axis of the third drive rollers 632. The third roller axis 631 is parallel to and spaced apart from the second roller axis 621.

The third drive rollers 632 are spaced apart from each other along the third roller axis 631, and are each arranged in a space between adjacent second drive rollers 622. In particular, one end of each of the third drive rollers 632 is arranged in a space between adjacent second drive rollers 622. As a result, portions of the second drive rollers 622 and the third drive rollers 632 look overlapped if viewed from the direction of the first roller axis 611, as shown in FIG. 7.

The third drive rollers 632 contact the substrate 100 so as to rotate in the same direction as the transferring direction of the substrate 100. The substrate 100 is transferred from the feed roll 110 to the take-up roll 120, and wound up on the take-up roll 120 at least partially due to the rotation of the third drive rollers 632.

The spaces between adjacent second drive rollers 622 should be large enough for the arrangement of their respective third drive rollers 632. That is, the second drive rollers 622 should be spaced apart from each other such that the interval between the second driver rollers 622 is larger than the thickness of each of the third drive rollers 632 in order to arrange the third drive rollers 632 each between adjacent second driver rollers 622.

The electrolyzer 605 holds the electrolytic solution 607. The substrate 100 is disposed in the electrolyzer 605 in order to be in contact with the electrolytic solution 607. The electrolytic solution 607 includes metal ions to be plated on the substrate 100. For example, the electrolytic solution 607 may include nickel ions, gold ions, or various other metal ions.

The power supply unit 640 supplies power to the electrolytic solution 607 and the substrate 100. An anode plate 645 is electrically connected with one end of the power supply unit 640, and contacts the electrolytic solution 607. The other end of the power supply unit 640 is connected to the substrate 100 as will be further described with reference to FIG. 8.

As shown in FIG. 8, a continuous-type cathode device 650 contacts the substrate 100. The continuous-type cathode 650 includes at least one rotation axis 651, a conveyor 652, and contact point apparatuses 653. The conveyor 652 extends between two rotation axes 651 as shown. The conveyor 652 may be moved by the rotation axis 651 according to track-laying movement. Also, the contact point apparatuses 653 are connected to the conveyor 652.

As the conveyor 652 rotates, the contact point apparatuses 653 also move according to track-laying movement. The conveyor 652 is formed of a conductive material, and one end of the conveyor 652 is electrically connected to the power supply unit 640. The contact point apparatuses 653 contact the substrate 100 while rotating.

Since the substrate 100 is transferred using a roll-to-roll method, if a cathode electrode which is electrically connected to the substrate 100 to supply power thereto is fixed, movement of the substrate 100 is not easily performed.

According to the present invention, the plating apparatus 600 includes the continuous-type cathode 650 so that the contact point apparatuses 653 contacting the substrate 100 move according to a track-laying movement. Since the contact point apparatuses 653 contact the substrate 100 while the substrate 100 moves, power may be easily supplied from the power supply unit 640 to the substrate 100 without disturbing the transfer of the substrate 100.

According to the roll-to-roll substrate transfer apparatus, the wet etching apparatus including the roll-to-roll substrate transfer apparatus, and the apparatus for manufacturing a printed circuit board of the present invention, a thin film substrate can be conveniently transferred without breakage.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A roll-to-roll substrate transfer apparatus comprising:
a feed roll and a take-up roll between which a substrate is to extend; and
a plurality of parallel drive roller rows to transmit motive power to the substrate for moving the substrate in a linear transferring direction, each drive roller row of the plurality of parallel drive roller rows includes a roller axis arranged in a direction perpendicular to the linear transferring direction of the substrate, and a plurality of spaced-apart drive rollers on the roller axis,
wherein drive rollers of one drive roller row are arranged in spaces between drive rollers of adjacent drive roller rows.

2. The apparatus of claim 1 wherein each drive roller row of the plurality of parallel drive roller rows further comprises a power source for rotating the plurality of spaced-apart drive rollers.

3. The apparatus of claim 1 wherein a first subset of the plurality of parallel drive roller rows is configured to contact a first surface of the substrate, and
wherein a second subset of the plurality of parallel drive roller rows is configured to contact a second surface of the substrate.

4. The apparatus of claim 3 wherein the first subset is configured in at least one group of drive roller rows, and
wherein the second subset is configured in at least one group of drive roller rows.

5. The apparatus of claim 4 further comprising nozzles for spraying an etching solution, the nozzles being configured in spaces between groups of drive roller rows.

6. The apparatus of claim 1, further comprising a tension-maintaining member to uniformly maintain the tension of the substrate while the substrate is being transferred.

7. The apparatus of claim 1 wherein the drive rollers of the parallel drive roller rows have a same diameter, and a distance between adjacent drive roller rows is less than the diameter.

8. A roll-to-roll substrate transfer apparatus comprising:
a feed roll and a take-up roll for continuous transfer of a substrate using a roll-to-roll method;
a first drive roller row to contact a surface of the substrate for transmitting motive power to the substrate to move the substrate in a linear transferring direction, the first drive roller row including a first roller axis arranged in a direction perpendicular to the transferring direction of the substrate, and a plurality of first drive rollers spaced apart from each other along the first roller axis;

a second drive roller row to contact the surface of the substrate for transmitting motive power to the substrate to move the substrate in the linear transferring direction, the second drive roller row including a second roller axis parallel to and spaced apart from the first roller axis, and a plurality of second drive rollers spaced apart from each other along the second roller axis such that the second drive rollers are arranged in spaces between adjacent first drive rollers; and a third drive roller row to contact the surface of the substrate for transmitting motive power to the substrate to move the substrate in the linear transferring direction, the third drive roller row including a third roller axis parallel to and spaced apart from the second roller axis, and a plurality of third drive rollers spaced apart from each other along the third roller axis such that the third drive rollers are arranged in spaces between adjacent second drive rollers.

9. The apparatus of claim 8, wherein the first drive rollers and the third drive rollers are aligned in the linear transferring direction.

10. The apparatus of claim 8, further comprising fourth, fifth and sixth drive roller rows substantially similar to the first, second and third drive roller rows respectively, wherein the fourth, fifth and sixth drive roller rows are configured to contact an opposite surface of the substrate.

11. The apparatus of claim 10, wherein the fourth drive rollers and the sixth drive rollers are aligned in the linear transferring direction.

12. The apparatus of claim 8, further comprising a tension-maintaining member to uniformly maintain the tension of the substrate while the substrate is being transferred.

13. A wet etching apparatus comprising:

a feed roll and a take-up roll between which a printed circuit board substrate is to extend;

a plurality of parallel drive roller rows to transmit motive power to the substrate for moving the substrate in a linear transferring direction, each drive roller row of the plurality of parallel drive roller rows includes a roller axis arranged in a direction perpendicular to the linear transferring direction of the substrate, and a plurality of spaced-apart drive rollers on the roller axis, and a nozzle arranged to face the substrate and to spray an etching solution, wherein drive rollers of one drive roller row are arranged in spaces between drive rollers of adjacent drive roller rows.

14. The apparatus of claim 13 wherein each drive roller row of the plurality of parallel drive roller rows further comprises a power source for rotating the plurality of spaced-apart drive rollers.

15. The apparatus of claim 13 wherein a first subset of the plurality of parallel drive roller rows is configured to contact a first surface of the substrate, and wherein a second subset of the plurality of drive roller rows is configured to contact a second surface of the substrate.

16. The apparatus of claim 15 wherein the first subset is configured in at least one group of drive roller rows, and wherein the second subset is configured in at least one group of drive roller rows.

17. The apparatus of claim 16 wherein the nozzle is configured to spray the etching solution in spaces between groups of drive roller rows.

18. The apparatus of claim 13, further comprising a tension-maintaining member to uniformly maintain the tension of the substrate while the substrate is being transferred.

19. An apparatus for manufacturing a printed circuit board comprising:

a feed roll and a take-up roll between which a printed circuit board substrate is to extend;

a plurality of parallel drive roller rows to transmit motive power to the substrate for moving the substrate in a linear transferring direction, each drive roller row of the plurality of parallel drive roller rows includes a roller axis arranged in a direction perpendicular to the linear transferring direction of the substrate, and a plurality of spaced-apart drive rollers on the roller axis, a nozzle arranged to face the substrate and to spray an etching solution; and a laser drilling apparatus and an exposure apparatus disposed in the path of the substrate, wherein drive rollers of one drive roller row are arranged in spaces between drive rollers of adjacent drive roller rows.

20. An apparatus for manufacturing a printed circuit board comprising:

a feed roll and a take-up roll between which a printed circuit board substrate is to extend;

a plurality of parallel drive roller rows to transmit motive power to the substrate for moving the substrate in a linear transferring direction, each drive roller row of the plurality of parallel drive roller rows includes a roller axis arranged in a direction perpendicular to the linear transferring direction of the substrate, and a plurality of spaced-apart drive rollers on the roller axis; and a plating apparatus comprising a plurality of contact points through which current is to be applied to the substrate, and disposed in the path of the substrate, wherein drive rollers of one drive roller row are arranged in spaces between drive rollers of adjacent drive roller rows.

21. The apparatus of claim 20, wherein the plurality of contact points is to move according to track-laying movement.

* * * * *